(12) United States Patent
Feild et al.

(10) Patent No.: US 6,444,565 B1
(45) Date of Patent: Sep. 3, 2002

(54) DUAL-RIE STRUCTURE FOR VIA/LINE INTERCONNECTIONS

(75) Inventors: Christopher Adam Feild, Yorktown Heights; Roy Charles Iggulden, Newburgh; Rajiv Vasant Joshi, Yorktown Heights; Edward William Kiewra, Verbank, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/896,204

(22) Filed: Jun. 29, 2001

Related U.S. Application Data

(62) Division of application No. 09/320,612, filed on May 26, 1999.

(51) Int. Cl.⁷ .......................................... H01L 21/4761

(52) U.S. Cl. ....................... 438/622; 438/625; 438/627; 438/643; 438/671

(58) Field of Search ................................. 438/622, 625, 438/627, 643, 653, 671

(56) References Cited

U.S. PATENT DOCUMENTS

| | | | |
|---|---|---|---|
| 4,410,622 A | | 10/1983 | Dalal et al. |
| 4,614,021 A | * | 9/1986 | Hulseweh ................... 438/627 |
| 4,866,008 A | * | 9/1989 | Brighton et al. ............ 438/643 |
| 4,920,071 A | * | 4/1990 | Thomas ...................... 438/653 |
| 5,719,446 A | | 2/1998 | Taguchi et al. |
| 5,728,631 A | | 3/1998 | Wang |
| 5,759,913 A | * | 6/1998 | Fulford, Jr. et al. ........ 438/624 |
| 5,856,703 A | | 1/1999 | Manning |
| 5,990,557 A | | 11/1999 | Avanzino et al. |
| 6,093,633 A | | 7/2000 | Matsumoto |
| 6,204,200 B1 | | 3/2001 | Shich et al. |

* cited by examiner

*Primary Examiner*—T. N. Quach
(74) *Attorney, Agent, or Firm*—Scully, Scott, Murphy & Presser; Louis Percello

(57) ABSTRACT

A structure and process to define a via/interconnect structure is described. The structure is formed by reactive ion etching (RIE) where vias are formed first then the interconnects. The disclosed method relies on first depositing a metal with a thickness equivalent to the total height of the via and interconnect. Once vias are delineated by forming a hard mask and lithography, the lines are patterned using a lithographic step. Vias and lines are formed using lithography and RIE in one step and interfacial integrity is maintained resulting in high electromigration performance.

20 Claims, 10 Drawing Sheets

Before Etching

After Etching

DUAL-RIE STRUCTURE FOR VIA/LINE INTERCONNECTIONS

DESCRIPTION

This application is a divisional of U.S. application Ser. No. 09/320,612 filed on May 26, 1999.

Field of the Invention

The present invention relates to an on-chip interconnect structure and to a method of fabricating the inventive on-chip interconnect structure for use in semiconductor/display technology.

BACKGROUND OF THE INVENTION

As the number of transistors and functions on a CPU chip increases, there exists a need for interconnecting such devices with minimum delay and high wiring yield. This point is illustrated in the Semiconductor Industry Association (SIA) roadmap.

In recent years, there has been a rapid development in back-end-of-the line (BEOL) wiring technology used in fabricating semiconductor chips. Presently, VLSI circuits use Al-Cu for via/interconnects. Such a structure, which is shown in FIGS. 1a–1b, is mainly used in logic and memory applications. In such structures, an Al-Cu layer is conventionally used as an interconnect region which is in contact with a via filled with chemical vapor deposited (CVD) tungsten (W). Once the front end devices are formed, W is filled in the contact holes and short interconnect lines 105, i.e. the M0 or low resistivity interconnect lines, are formed using a liner/diffusion barrier. After W is polished off from the field area to form M0 interconnect and contacts, an oxide or other dielectric material 100 is deposited on top of the M0/contact structure, and via holes 90 are patterned and etched into oxide 100 to contact down to M0 level 105 (See, FIG. 1a).

As shown in FIG. 1b, CVD W 106 is formed in the via which is lined with a liner/barrier 104 and thereafter the CVD W is polished off from the field area. Liner 102 is formed on the structure and a low resistivity interconnect line 103 composed of Al-Cu is deposited on the planar surface by sputtering. Another liner/barrier layer 102 is formed on top of interconnect line 103 and then layers 102 and 103 are patterned using conventional lithography and reactive-ion etching (RIE). This method provides the patterned structure shown in FIG. 1b. It is noted that in this structure interconnect regions 105 and 103 are isolated from CVD W 106 by liner/barrier regions 104 and 102.

The structure illustrated by FIGS. 1a–1b causes electromigration problems due to inhomogeneous interfaces which are formed by flux divergence. Since CVD W has a high melting point, it does not move under an electron current. Al-Cu, on the other hand, does move under an electron current thereby creating a void at the interface of CVD W 106 and interconnect regions 105 and 103.

To avoid this problem, interconnect region 103 is deposited into vias as well as on the planar surface as shown in FIGS. 2a–2b and then etched to form the via and line in one step. This particular prior art method has drawbacks associated therewith which include: (1) the need for depositing Al-Cu at high temperatures (above 400° C.) to fill the vias; (2) improved liners which cause inhomogeneous interfaces that lead to electromigration problems; and (3) the repetition of high temperature deposition to form multilevel interconnects which can cause stress voiding especially on already formed layers.

Alternate methods of using Al-Cu, Cu, or Cu-alloys as interconnects are also known in the prior art. One prior art method is a dual damascene structure shown in FIGS. 3a–3b wherein a thick oxide/thin nitride mask is first deposited. Using lithography and RIE, lines are patterned by removing the thin nitride mask. Via holes are then printed on the resist and the lines/vias are etched to the desired depth by RIE. The lines/vias are filled with a suitable metal using a physical vapor deposited (PVD) liner 107 and metal seed layer, and then interconnect 103 is formed by CVD or electroplating. Any metal on the field is polished off to form an interconnect and via in one step. Prior art dual damascene techniques require good metal fill characteristics. When Al-Cu is employed in prior art damascene processes, such techniques require high temperatures, wherein any subsequent polishing step becomes a problem; polishing adds one more expensive steps in the integration of these metals.

As integration continues on Ultra Large Scale the cost of wafer manufacturing increases significantly. Conventional low cost DRAM (dynamic random access memory) based technologies and DSP processors still use Al-Cu interconnect and additional polishing steps to form lines/vias which can increase the cost of fabrication. The prior art method shown in FIGS. 2a–2b, which relies on homogeneous interfaces, requires high temperature deposition and multi-step processing (especially deposition by CVD followed by high temperature PVD deposition). The alternative prior art method, which is shown in FIGS. 3a–3b, relies on polishing to form interconnect lines. The polishing step is challenging due to scratching, erosion and pattern sensitivity problems (i.e. large areas get eroded faster and smaller less). For DRAM applications, polishing of Al-Cu interconnects adds to the overall processing cost. As the dimensions get very fine, particularly for Cu metallurgy, the liner thickness consumes the large area in a dual damascene process. This can lead to increased resistivity.

Based on the above drawbacks with prior art processes, there exists a need for developing a new and improved method and structure which is capable of forming an interconnect line and via in one step or multisteps. Any method developed should be applicable to both logic and memory devices as well as system-on-chip applications. It would be especially beneficial if a method was developed which could form the via in the structure prior to line fabrication. Such a method would maintain the interfacial integrity between the via and line regions resulting in high electromigration performance.

SUMMARY OF THE INVENTION

One object of the present invention is to provide a method of fabricating a semiconductor structure wherein a via and an interconnect line (sometimes referred to herein as metal line or wire) are made sequentially in one step, rather than prior art multistep processes.

Another object of the present invention is to provide a method of fabricating a via/interconnect structure which has high electromigration performance associated therewith due to interfacial integrity that exists between the vias and lines of the structure.

A further object of the present invention relates to a method of fabricating a via/interconnect structure wherein the interconnect lines do not encounter any polishing steps during the manufacture thereof.

A still further object of the present invention is provide a method of fabricating a via/interconnect structure wherein CVD W is employed as the via fill material and Al-Cu is employed as the metal line or interconnect material.

A yet further object of the present invention is to provide a multistep process wherein two RIE steps are employed in forming metal lines and vias. In the multistep process, no polishing step is utilized in fabricating the interconnect structure.

These and other objects and advantages are achieved utilizing the methods of the present invention. In one method of the present invention, a via is first defined and thereafter the metal line is formed. In another method of the present invention, two RIE steps are used in forming the metal lines and vias of the interconnect structure.

Specifically, the first method of the present invention comprises the steps of:

(a) forming a metal stack on a surface of a substrate, said metal stack comprising deposition of at least a first metal layer and a second metal layer;

(b) forming a masking layer on said metal stack provided in step (a);

(c) patterning said masking layer providing a via mask on said metal stack;

(d) etching said metal stack using said via mask to first define vias in said metal stack and thereafter metal lines, said vias being composed of said second metal layer and said metal lines being composed of said first metal layer;

(e) depositing a dielectric material on said structure provided in step (d) surrounding said vias and lines; and (f) planarizing the dielectric layer stopping at said vias.

The above processing steps can be repeated any number of times to provide multiple interconnect levels in the structure wherein a via region is first defined and thereafter the metal line region is formed.

In an alternative embodiment of the method of the present invention, barrier layers may be formed between the substrate and the first metal layer; between the first metal layer and the second metal layer; on top of said second metal layer; or between said first and second metal layers and on top of said second metal layer. An optional barrier layer may also be formed on sidewalls of said vias and metal lines after conducting step (d).

In accordance with the multistep process of the present invention, two RIE steps are employed in forming the interconnect structure. Specifically, this aspect of the present invention comprises the steps of:

(a) depositing a first metal layer on a surface of a substrate;

(b) forming a metal line from said first metal layer by lithography and RIE;

(c) depositing a second metal layer on said metal line, said second metal layer having the thickness of a via; and (d) forming a via from said second metal layer by lithography and RIE.

Another aspect of the present invention relates to a via/interconnect structure which is formed using the above processing steps. Specifically, the via/interconnect structure of the present invention comprises:

a substrate having at least one interconnect level formed thereon, said interconnect level comprising a metal line and a via interconnected with each other, wherein said metal line and said via are interconnected by a substantially homogeneous interface.

DETAILED DESCRIPTION OF THE INVENTION

Figure 1A:
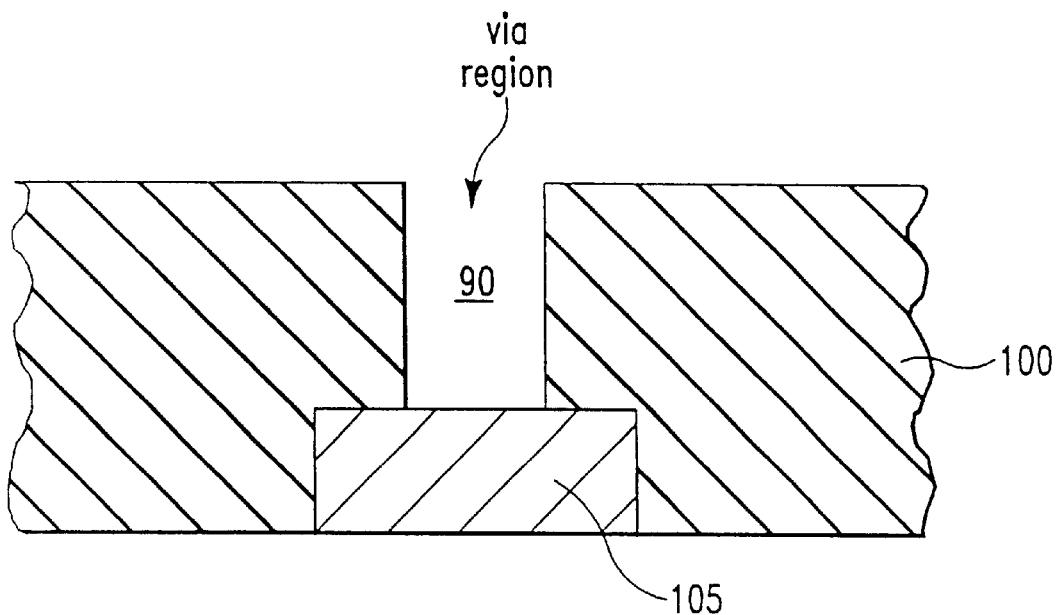
FIGS. 1a–1b are cross-sectional views depicting a prior art method for forming an interconnect structure containing an Al-Cu interconnect line and a CVD W filled via.
Figure 1B:
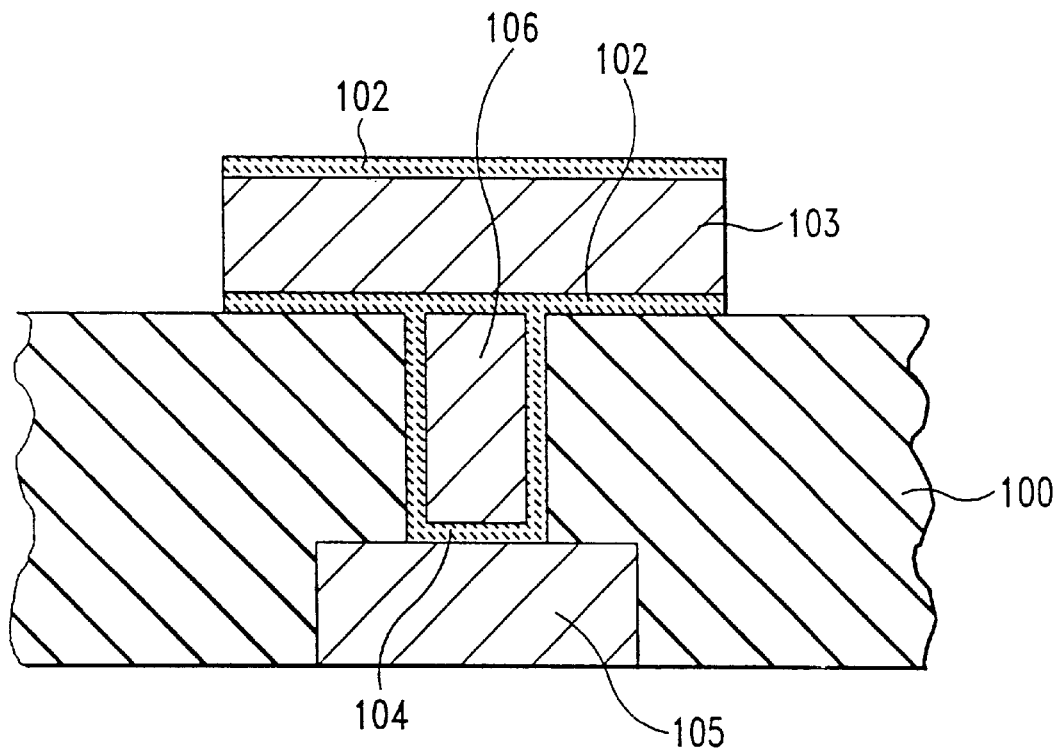
Figure 2A:
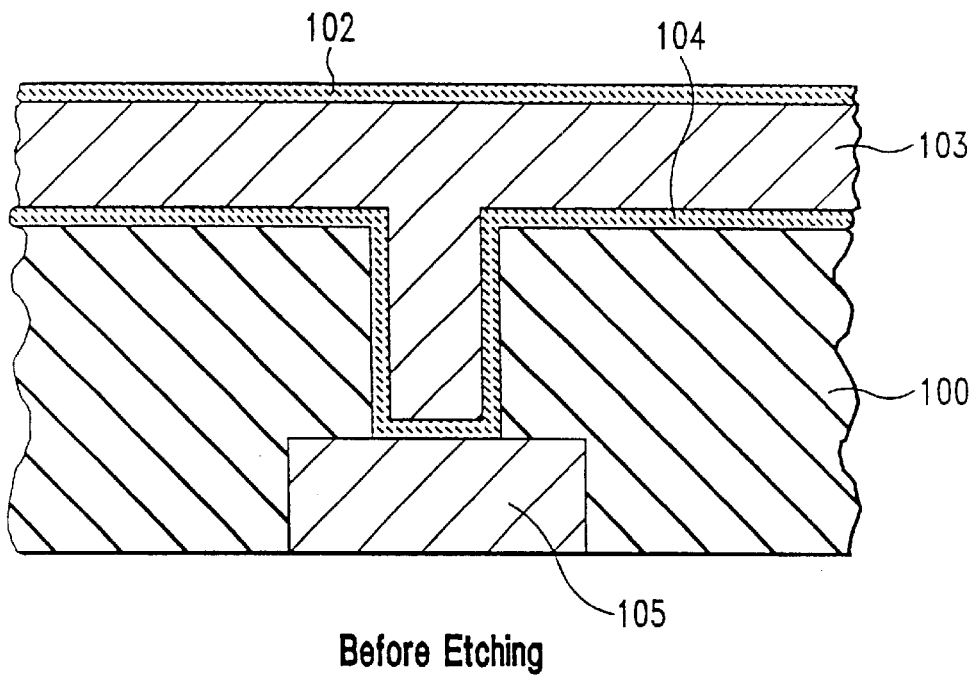
FIGS. 2a–2b are cross-sectional views depicting a prior art method for fabricating an interconnect structure having homogeneous interfaces.
Figure 2B:
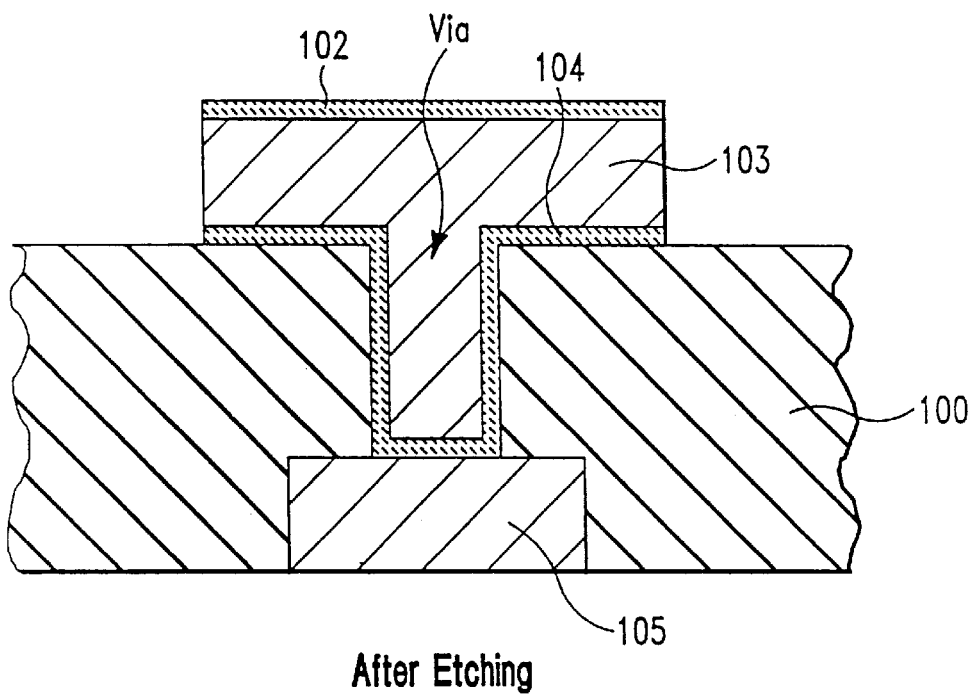
Figure 3A:
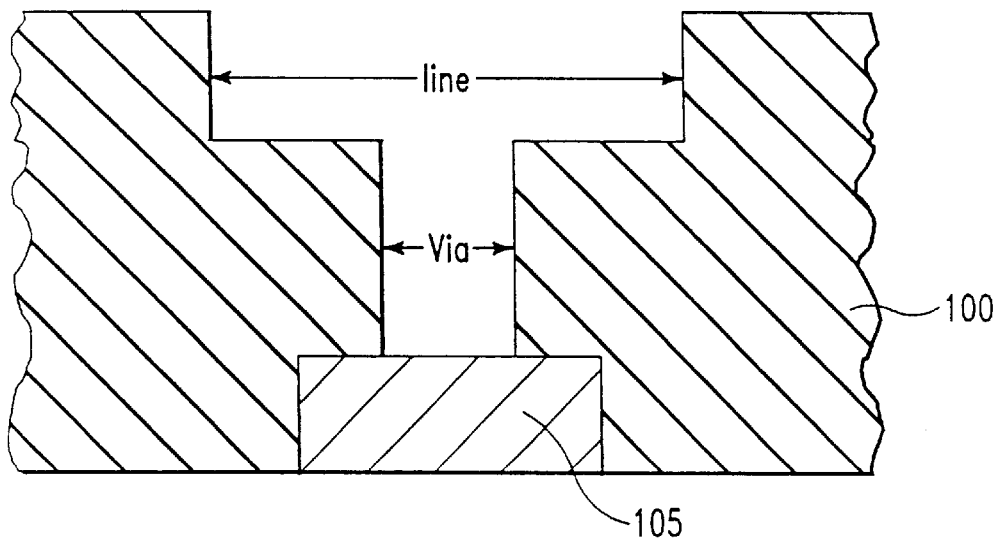
FIGS. 3a–3b are cross-sectional views depicting a prior art dual damascene process wherein the metal line region is first formed and thereafter the via region is formed.
Figure 3B:
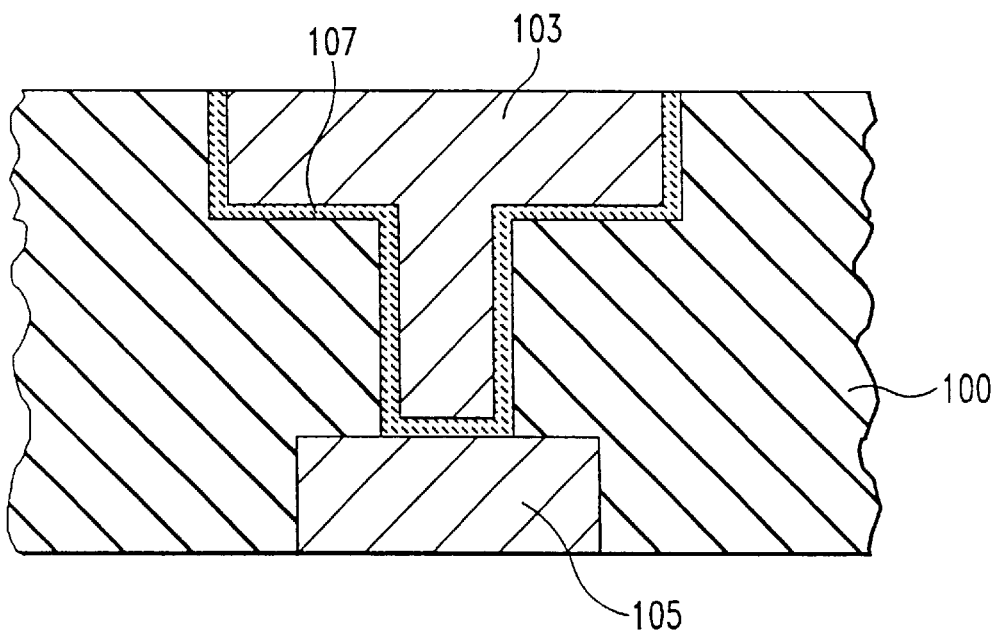

The present invention, which provides methods of fabricating a via/interconnect structure having substantially homogeneous interfaces between metal lines and vias, will now be described in greater detail by referring to the drawings that accompany the present application. It is noted that like reference numerals are used in the drawings to describe like and/or corresponding elements of the same.

Referring first to FIGS. 4a–4g, there is shown the basic steps that are employed in one of the methods of the present invention. Specifically, after the front of the line device and contact structure are formed, the via/line structure of the present invention is created in one step using the first method of the present invention.

The first method of the present invention is opposite of conventional dual damascene processes wherein lines/vias are formed in one step. In the present invention, the via is first defined and thereafter the metal line is formed. This is in contrast to damascene technology wherein the metal line is first defined and thereafter the via is formed in the structure.

Figure 4A:
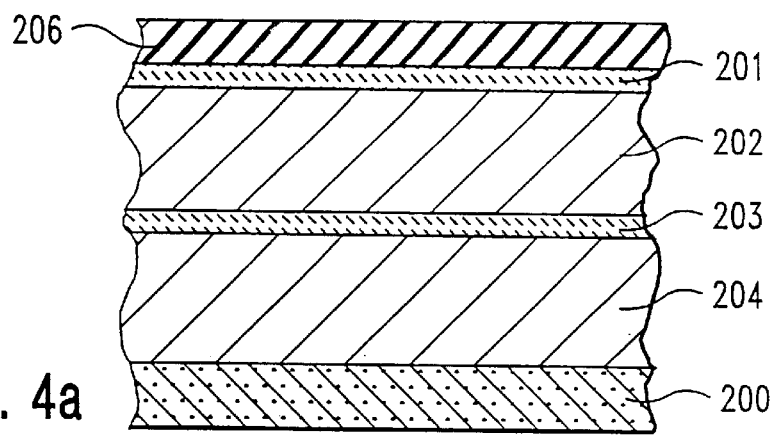
FIGS. 4a–4g are cross-sectional views depicting the first method of the present invention which is used in fabricating a multilevel via/interconnect structure using a combined one step etch process.

Specifically, in accordance with the first method of the present invention and as shown in FIG. 4a, a first metal layer 204 is deposited on the surface of substrate 200 having devices formed therein. Substrate 200 may be a semiconductor chip or wafer which is prepared using conventional techniques well known in the art. Substrate 200 may contain various interconnect regions on the surface thereof. An optional barrier layer, not shown in FIGS. 4a–4g, may isolate substrate 200 from first metal layer 204 (See FIG. 5a).

First metal layer 204 can be composed of a conductive metal or metal alloy having low resistivity including, but not limited to: Al, Cu, W, Ag, Au and alloys or compounds thereof. Mixtures and multilayers thereof are also contemplated herein. The term "low resistivity" is employed in the present invention to denote a conductive metal or metal alloy that has a resistivity value of from 20 $\mu$ohm.cm or less. Layer 204 is formed using any conventional deposition process including, but not limited to: chemical vapor deposition (CVD), plasma-assisted CVD, physical vapor deposition (PVD), sputtering, electroplating and other like deposition processes. The overall thickness of layer 204 is not critical to the present invention, but it typically has a thickness of from about 10 to about 800 nm.

Without breaking the vacuum of the deposition process, an optional thin lower barrier layer 203 composed of a refractory metal, a refractory metal alloy or any other metal that can serve as an etch stop layer is deposited on first metal layer 204. For example, Ti/TiN can be used for Al-alloys and Ta, W, Co or alloys thereof can be used for Cu and Cu-alloys. Optional lower barrier layer 203 is employed as an etch stop or diffusion barrier layer.

Next, a second metal layer 202 composed of the same or different conductive metal or metal alloy as first metal layer 204 is deposited on the surface of first metal layer 204 or optional barrier layer 203. The second metal layer has a via thickness of from about 10 to about 800 nm.

An optional upper barrier layer 201 such as Ti/TiN is then deposited on top of second metal layer 202 without breaking vacuum of the deposition process. A layer of masking material 206 composed of an oxide, a nitride, a combination of both an oxide and a nitride, or other like low dielectric constant materials ($\epsilon$=10 or below) is then deposited on the uppermost surface of the metal stack, i.e. second metal layer 202 or optional upper barrier layer 201. The masking material is typically a hard dielectric material that is used in forming the via region of the structure.

Figure 4B:
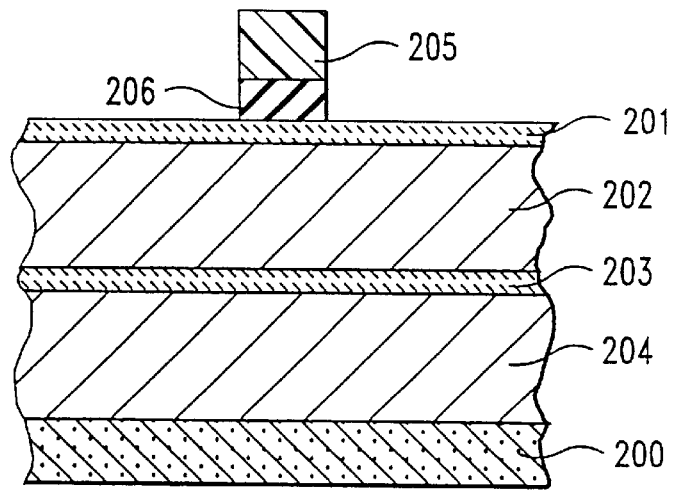
Figure 5A:
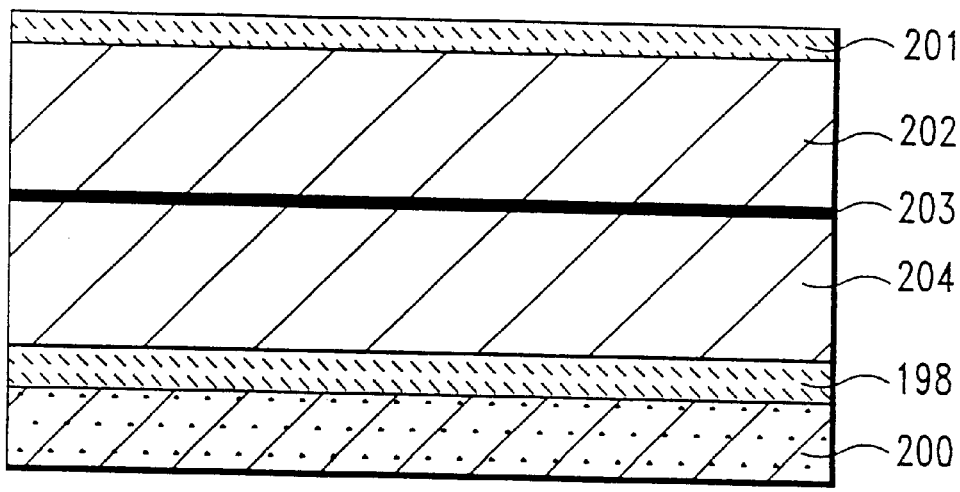
FIGS. 5a–5h are cross-sectional views depicting an alternative embodiment of the method shown in FIGS. 4a–4g.

Using lithography, resist 205 is deposited and exposed for vias and then patterned. Masking layer 206 is etched partially to delineate vias in the structure. These steps of the present invention are illustrated in FIG. 4b. After etching, resist 205 is stripped from the structure using conventional stripping processes well known to those skilled in the art.

Figure 4C:
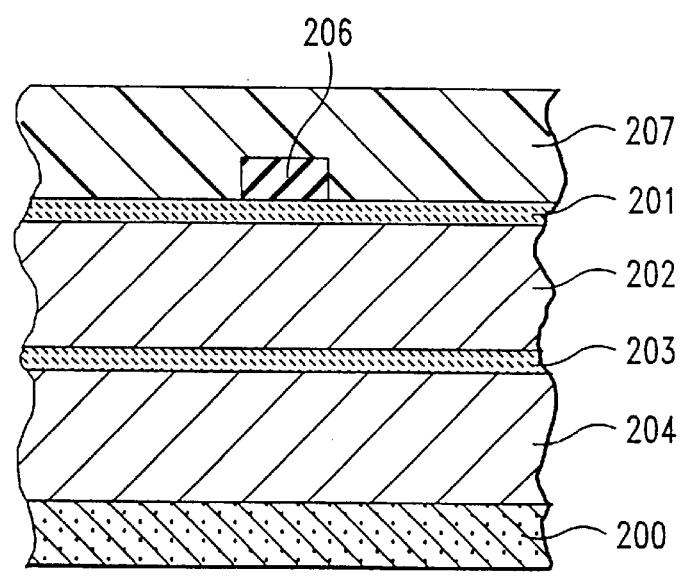
Figure 4D:
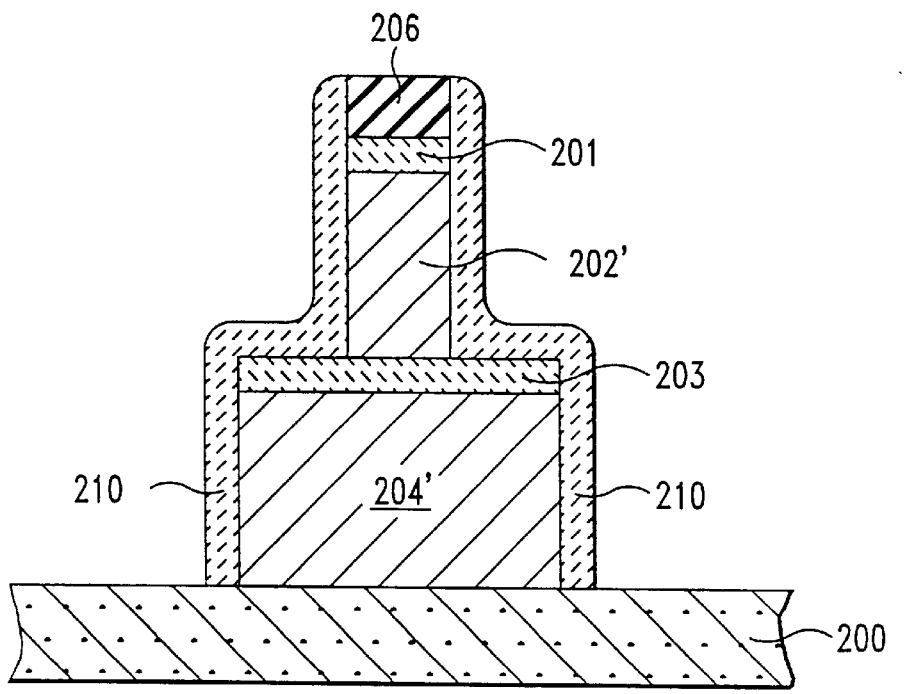

Next as shown in FIG. 4c, resist 207 is formed on the structure. The resist and pattern mask are employed in defining the vias and the metal lines in the structure. Metal layers 202, 204 and any optional barrier layer present in the structure are thereafter etched at the same time to first form via region 202' and thereafter metal line region 204' (FIG. 4d).

A diffusion barrier 210 may be optionally deposited and etched back to form a barrier layer on the sidewalls of the structure. This optional technique (deposition and etchback) provides a means for controlling the thickness of optional barrier layer 210. The etchback process may not be needed for less diffusing species such as Al-Cu. Instead, conventional deposition processes can be used in forming optional barrier layer 210. Typically, when present, optional barrier layer 210 has a thickness of from about 0 to about 100 nm. The same range applies for all other optional barrier layers that may be present in the structure.

Figure 4E:
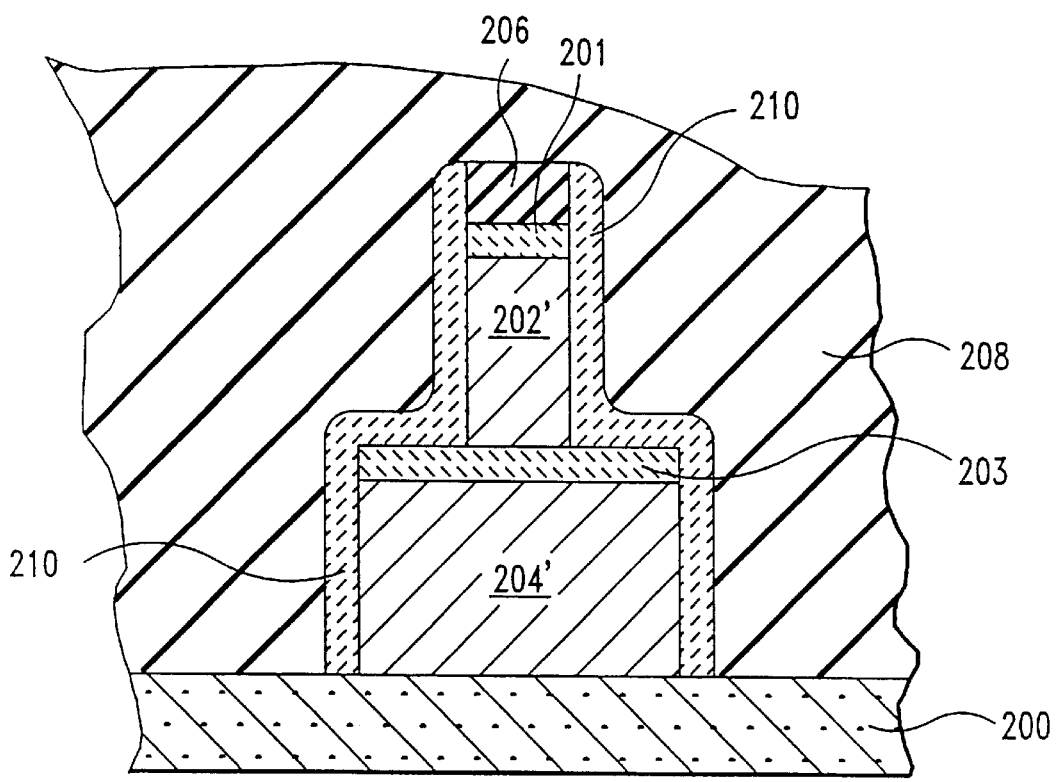
Figure 4F:
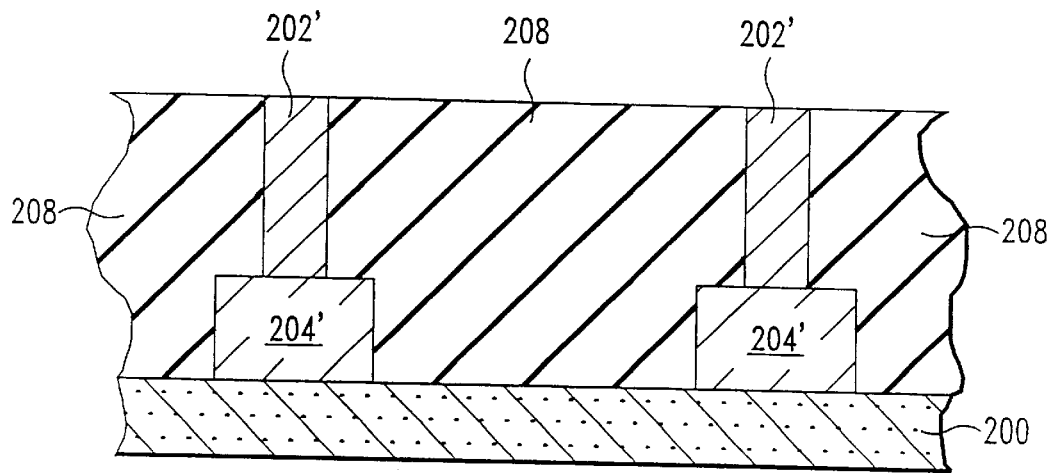

In accordance with the next step of the present method and as shown in FIG. 4e, a high density plasma oxide 208 or other low dielectric constant material such as a nitride or oxynitride is deposited between via pillars and lines. Region 208 is polished off up to via 202' or, if present, upper barrier layer 201. Chemical-mechanical polishing (CMP) or other conventional polishing steps may be employed in the present invention. Upper barrier layer 201 is removed using RIE providing the structure shown in FIG. 4f. As shown, the structure contains metal lines 204' and vias 202' which are spaced apart by region 208.

Figure 4G:
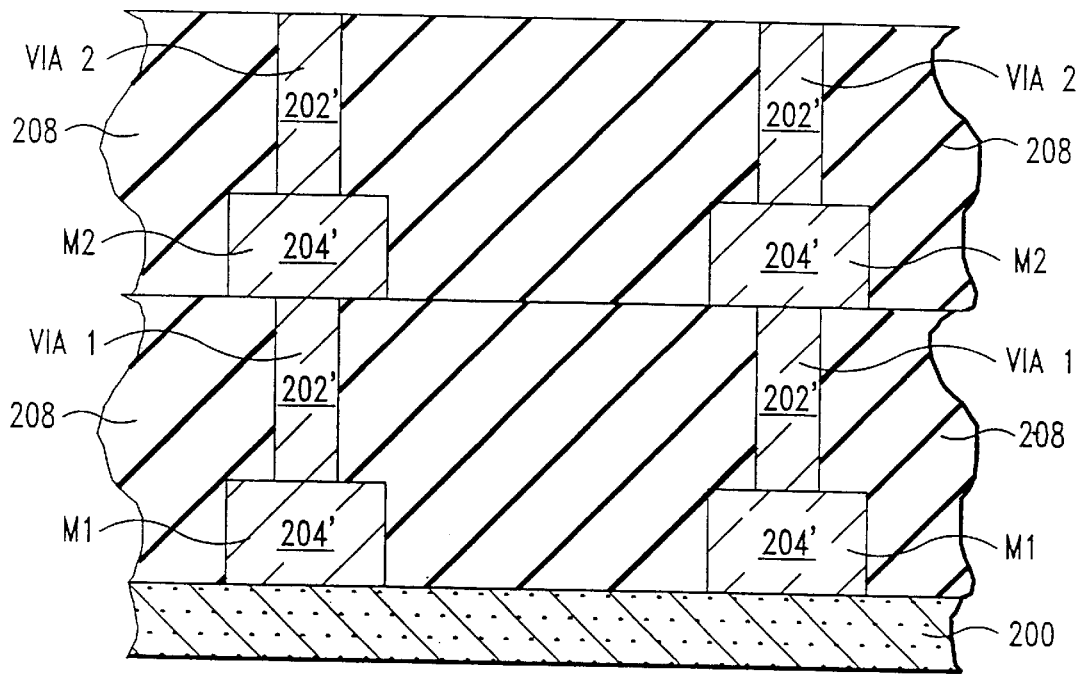

The various processing steps described above may be repeated any number of times to provide multiple interconnect levels on the structure, See FIG. 4g. In FIG. 4g, M1 denotes the first metal or wiring level; VIA1 is the first via which connects M1 to M2; M2 is the second metal or wiring level; and VIA2 is the second via connecting M2 to either another metal level or an external device. The resultant structure of the present invention results in minimal interfacing and therefore proves to be excellent in terms of its electromigration.

Also during oxide or dielectric deposition, an artificial air-gap can be created to lower the dielectric constant of the oxide or dielectric material surrounding the vias and metal lines.

As stated above, FIGS. 4a–4g describe the basic processing steps of the present invention, the following description, with reference to FIGS. 5a–5h, provides a more detailed description of the present invention wherein the artificial air gap embodiment is depicted and described in greater detail. These figures also show the presence of an optional barrier layer 198 between substrate 200 and first metal layer 204.

Specifically, metal deposition for the process of the present invention consists of creating both the wire level (metal line) and via level stack. Metal layers 204 and 202 of the metal stack (See FIG. 5a) may be formed from aluminum, copper, tungsten, or other metallics, including refractory metals or their alloys or compounds and may be isolated from each other by an optional lower barrier layer 203. The metal stack may be homogeneous or doped (e.g., Cu doping for improved electromigration). The metal stack may be deposited by various techniques, such as evaporation or chemical vapor deposition (CVD), but the more common deposition process would be physical vapor deposition (PVD). The total stack thickness can be anywhere from about 100 nm to about 4 um. An upper barrier layer 201 may optionally be formed on second metal layer 202 using conventional deposition processes well known to those skilled in the art.

Figure 5B:
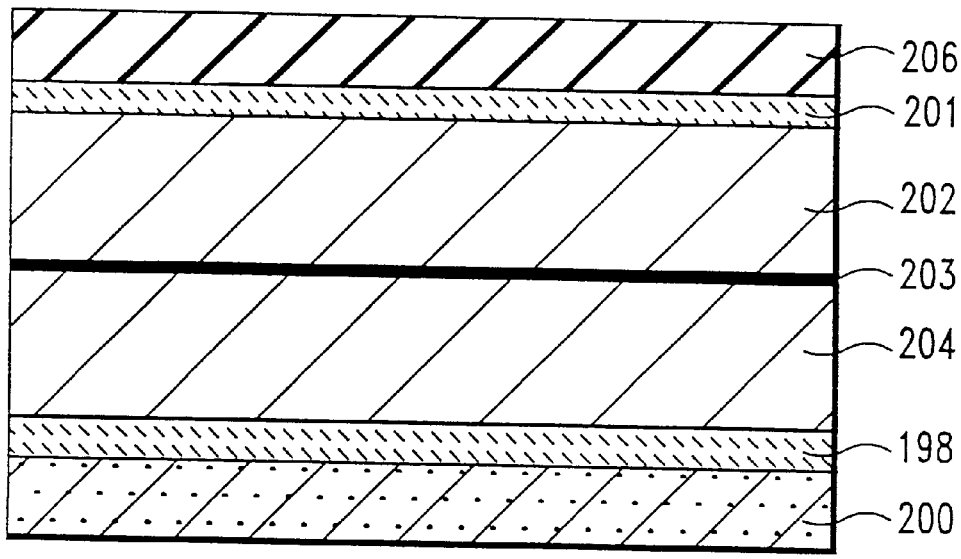

A hard-mask 206, as illustrated in FIG. 5b, is next required to define the contact vias. The hard-mask material can be a metal (including refractory metals, such as W, Ta or their compounds and alloys) or a dielectric (such as silicon oxide, silicon nitride, or silicon oxynitride). For a metallic hard-mask, either a PVD or CVD process would be preferred, although other deposition methods (i.e., evaporation) could also be employed. The hard-mask may also be doped to minimize conductance and/or to leverage etch resistance (selectivity). A thin hard-mask is desirable in the present invention such that subsequent wire lithography imaging is not distorted, but the hard-mask must also be thick enough to withstand the via RIE process (FIG. 5b). The hard-mask layer can be anywhere from 10 to 500 nm in thickness. After etching the metal stack, selective wet or dry etching can be used to remove the hard mask material or, it may be kept in place on the final structure.

Figure 5C:
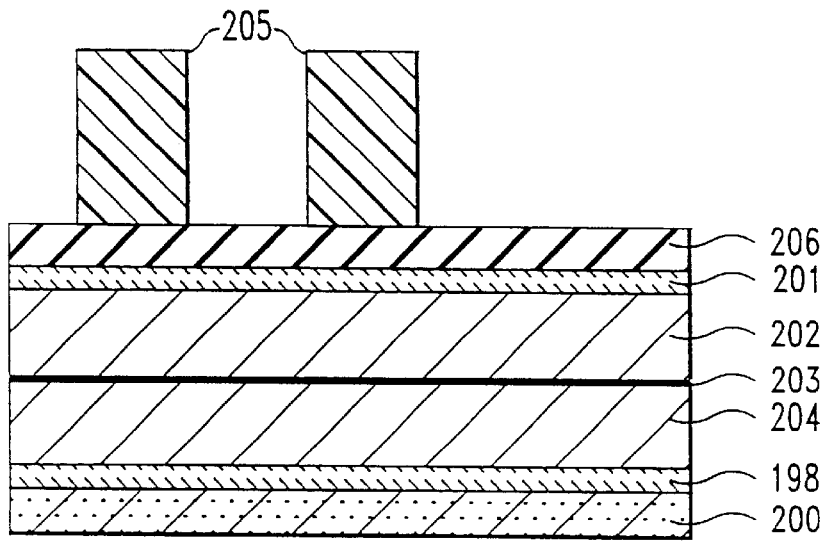

Via lithography is performed using conventional deep UV processing (FIG. 5c). A positive-tone resist 205 with a light-field mask is preferred; however, existing dark-field masks for conventional damascene via formation can be used with negative tone photoresists.

Figure 5D:
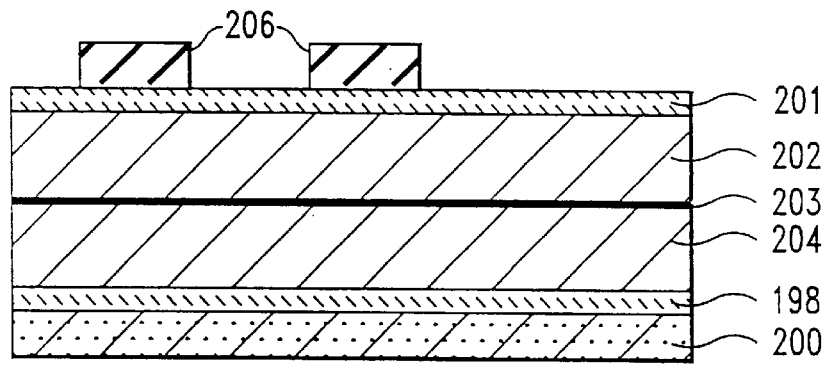
Figure 5E:
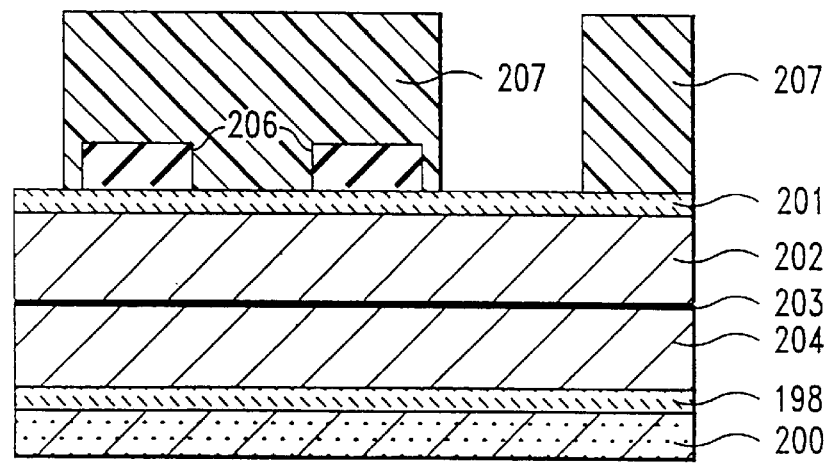

Once the via lithography is complete, pattern transfer to the hard-mask may be done through wet etching or conventional RIE (See FIG. 5d). The etch stop for the hard-mask is the top metal surface of the metal stack and/or the optional upper barrier layer 201. For metallic hard-masks, fluorine- or chlorine-based chemistry is preferred for pattern transfer, and for dielectric hard-mask options, $CH_xF_y$, $SF_6$, and/or $NF_3$ based chemistry (with adjuncts such as Ar, $N_2$, He, etc.) is preferred. Remaining photoresist is stripped by conventional techniques, such as oxygen or ozone RIE (with or without fluorine chemistry) and/or organic solvent strip processes. Image contrast between the patterned via "disks" and the underlying metal stack is critical for subsequent wire level lithography alignment. Wire level lithography (FIG. 5e) is performed using conventional deep UV processing, using either positive or negative tone photoresist 207. The wire level lithography aligns to the hard-mask via level through the image contrast of the patterned via "disks" relative to the metal stack. Etching the top barrier materials on the metal stack before wire level lithography may enhance the image contrast between the disks and the top of the metal stack. This optional processing step can be performed with either wet or dry chemistry (for example, a TiN top barrier film may be selectively etched to underlying Al with hot $H_2O_2$).

Figure 5F:
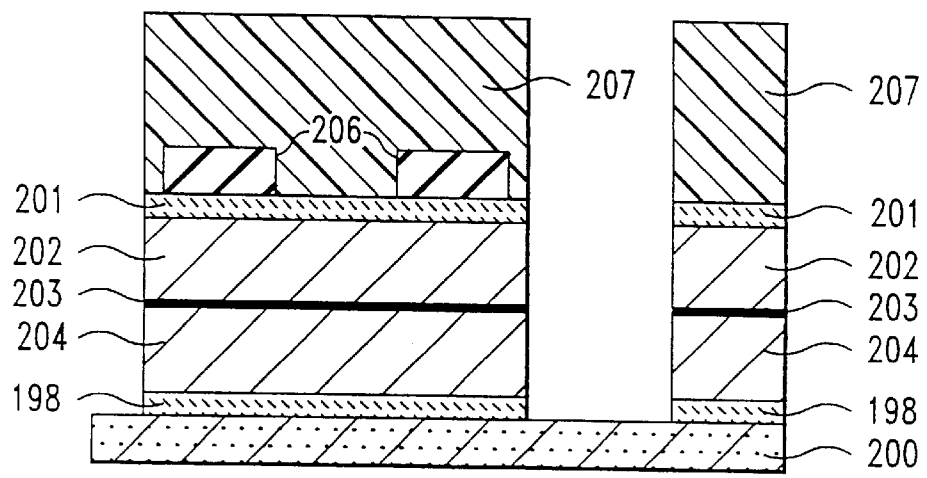
Figure 5G:
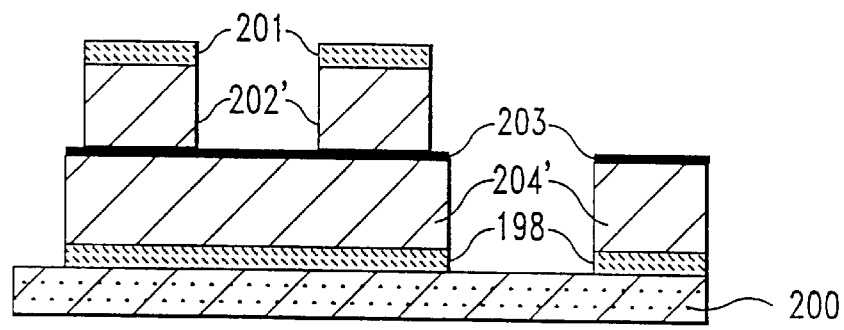
Figure 5H:
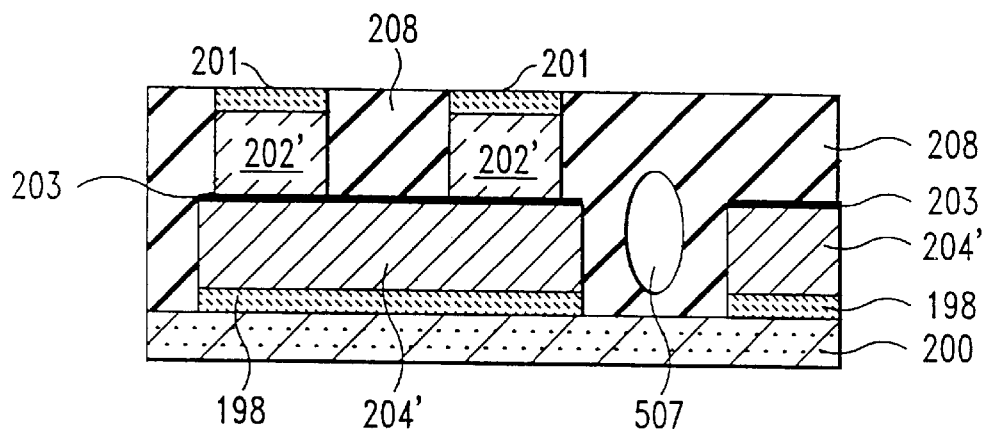

After wire level lithography, etching is performed to create the upper level via and the lower level wire (FIG. 5f). The etch may be done in one of two ways: (1) etch the full metal stack, strip the wire level photoresist, etch the top of the metal stack to form the vias on top of the wire, or (2) etch the wire through just the via (top) portion of the stack, strip the wire level photoresist, and etch both the remaining wire (bottom) and separate the vias (top) portion of the stack at the same time. Method (1) is preferred because it allows the via thickness and wire thickness to be independent, however, method (2) will also work and may be preferred when the via thickness is much larger than the wire thickness. The actual etch would be performed in a RIE system because of the required anisotropy of the etch. Etch chemistry would depend on the stack material, for example, aluminum or copper-based stacks would be etched with chlorine-based (HCl, $BCl_3$, $Cl_2$, etc.) chemistry, tungsten-based stacks would be etched with fluorine-based ($SF_6$, $NF_3$, $C_2F_6$, $CH_xF_y$, etc.), inhomogeneous via/wire stacks would be etched with combinations of the above chemistries (FIGS. 5g and 5h). The photoresist strip process in-between the first and second metal RIE steps (for either etch method) would be carried out in a similar manner to the via level photoresist strip process.

An important aspect of the structure of the present invention is the optional diffusion barrier between the via/line or the via 202'/line 204' interface itself. For inhomogeneous via/wire stacks, a re-entrant profile or undercut of lower barrier layer 203 in the metal line would result in a structure that has a preference for void (or air gap) 570 formation during subsequent dielectric oxide 208 gap-fill. This property is desired for a high-speed (low RC) back-end wiring process as it creates air gaps which lower the effective dielectric constant. Also, the remaining oxide or metal via hard-mask may be selectively removed after etching, or it may be kept in place.

Dielectric oxide fill is the first step for planarization. Silicon oxide from precursors such as tetraethylorthosilicate (TEOS) or $SiH_4$ (Silane) may be deposited in low-pressure (LP—), sub-atmospheric (SA—), or high-density plasma (HDP—) chemical vapor deposition (CVD) would be employed. Dopant materials (such as boron, phosphorous, or fluorine) may be used to enhance oxide re-flow, getter impurities, and/or lower the dielectric constant of the dielectric. The upper limit for the oxide deposition temperature would depend on the via/metal material (ex., <400° C. for Al, <600° C. for W). Oxide chemical-mechanical polishing (CMP) is the second step in the planarization process. Excess oxide is removed with standard CMP processes; typical slurries consist of fumed silica in a basic solution. A novel function of the optional upper barrier layer 201 is that it may also serve as a CMP stop layer. When the CMP operation is complete, the resulting structure is ready for subsequent wire and contact levels, which may be performed by damascene, RIE, lift-off, or another process sequence.

Figure 6A:
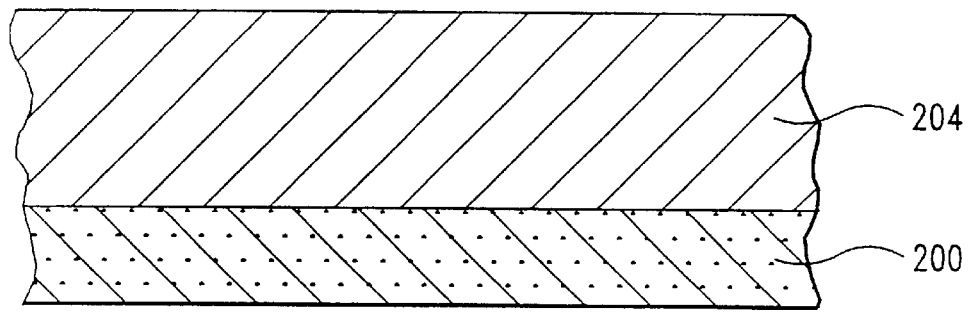
FIGS. 6a–6c show a second method of the present invention wherein two RIE steps are employed in fabricating the interconnect structure.
Figure 6B:
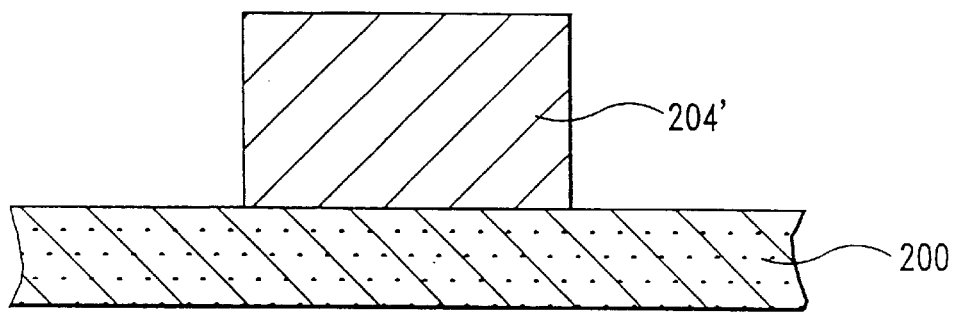
Figure 6C:
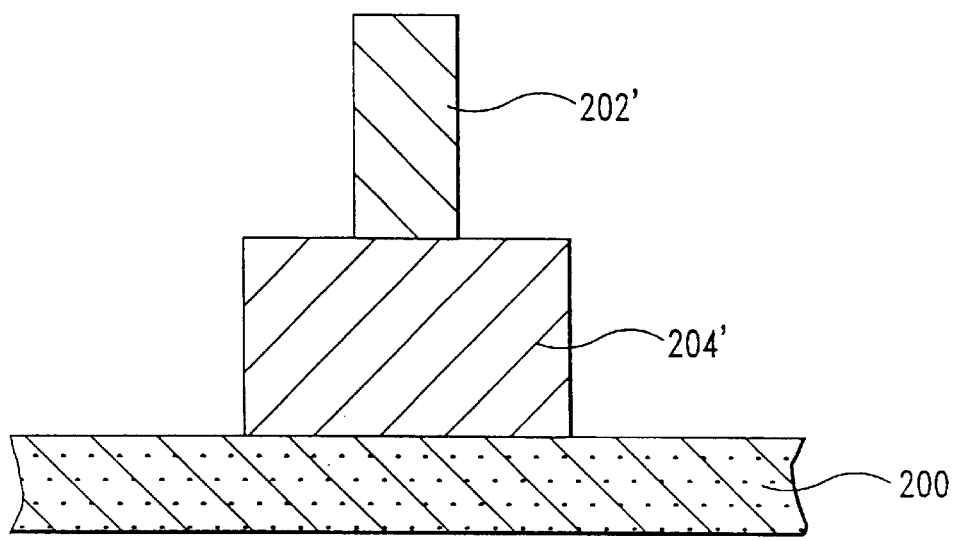

The above description describes a one step RIE process for forming an interconnect structure. FIGS. 6a–6c, and the description that follows, provides an illustration of a multistep RIE process that can be used in forming the inventive interconnect structure. Specifically, as shown in FIG. 6a, a first metal layer 204 is formed on a surface of substrate 200. An optional barrier layer may be formed between first metal layer 204 and substrate 200 and/or on top of first metal layer 204.

Using lithography, a resist is deposited and exposed for metal lines and then patterned using conventional techniques known in the art. The pattern is transferred to the first metal layer by etching, e.g. RIE. The structure after forming metal line 204' is shown in FIG. 6b.

A second metal layer 202 having the thickness of a via (10 to 800 nm) is then formed on the structure and that structure is subjected to lithography and etching, e.g. RIE, so as to pattern the second metal layer into via 202'. This provides the interconnect structure shown in FIG. 6c. A dielectric layer 208, not shown in FIGS. 6a–6c, is formed surrounding the metal line and via. Again, the above steps may be repeated any number of times to provide a multilevel interconnect structure. Optional barrier layers as described above can be present when the two step RIE process is utilized.

While this invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms described and illustrated, but fall within the scope of the appended claims.

Having thus described our invention in detail, what we claim as new, and desire to secure by the Letters Patent is:

1. A method of forming a via/interconnect structure comprising the steps of:
   (a) forming a metal stack on a surface of a substrate, said metal stack comprising deposition of at least a first metal layer and a second metal layer;
   (b) forming a masking layer on said metal stack;
   (c) patterning said masking layer providing a via mask on said metal stack;
   (d) etching said metal stack using said via mask to first define vias in said metal stack and thereafter, and at the same time, metal lines, said vias being composed of said second metal layer and said metal lines being composed of said first metal layer;
   (e) depositing a dielectric layer on the structure provided in step (d); and
   (f) planarizing the dielectric layer stopping on said vias.

2. The method of claim 1 wherein said first and second metal layers are composed of the same or different conductive material, said conductive material having a resistivity of 20 $\mu$ohm.cm or-less.

3. The method of claim 2 wherein said first and second metal layers are composed of a metal selected from the group consisting of Al, Cu, W, Ag, Au and alloys or compounds thereof.

4. The method of claim 3 wherein said first metal layer is composed of Al-Cu and said second metal layer is composed of W.

5. The method of claim 1 wherein said deposition of said metal layers is conducted using a process selected from the group consisting of chemical vapor deposition (CVD), plasma-assisted CVD, physical vapor deposition, sputtering, electroplating and other like deposition processes.

6. The method of claim 1 wherein an optional barrier layer is formed between said substrate and said first metal layer; between said first and second metal layers; on top of said second metal layer; or between said first and second metal layers and on top of said second metal layer.

7. The method of claim 6 wherein said optional barrier layer comprises a refractory metal, a refractory metal alloy or another metal which is capable of serving as an etch stop layer.

8. The method of claim 7 wherein said optional barrier layer comprises Ti/TiN, Ta, W, Co or alloys and compounds thereof.

9. The method of claim 1 wherein said masking layer is composed of a refractory metal, a nitride, an oxide, an oxynitride or any combination thereof.

10. The method of claim 9 wherein said masking layer is doped to minimize conductance and/or to enhance etch selectivity of step (d).

11. The method of claim 1 wherein step (c) is carried out using lithography and reactive ion etching (RIE) or wet etching.

12. The method of claim 1 wherein step (c) is carried out using fluorine or chlorine-based chemistry.

13. The method of claim 1 wherein step (d) is carried out by lithography and RIE or wet etching.

14. The method of claim 1 wherein step (d) is carried out using fluorine-based chemistry, chlorine-based chemistry, or a combination of fluorine and chlorine-based chemistry.

15. The method of claim 1 wherein said dielectric layer contains a void.

16. The method of claim 1 wherein said dielectric layer is composed of a nitride or an oxide.

17. The method of claim 1 wherein step (f) is carried out by chemical-mechanical polishing (CMP).

18. The method of claim 1 wherein steps (a)–(f) are repeated any number of times.

19. The method of claim 1 wherein an optional barrier layer is formed on sidewalls of the metal stack, said barrier layer being formed after etching said metal stack.

20. A method of forming a via/interconnect structure comprising the steps of:
  (a) depositing a first metal layer on a surface of a substrate;
  (b) forming a metal line from said first metal layer by lithography and reactive-ion etching (RIE);
  (c) depositing a second metal layer on said metal line;
  (d) forming a via from said second metal layer by lithography and RIE; and
  (e) forming a dielectric layer surrounding said metal line and said via, said dielectric layer containing a void therein.

* * * * *